(12) United States Patent
Miyajima et al.

(10) Patent No.: US 6,848,320 B2
(45) Date of Patent: Feb. 1, 2005

(54) MECHANICAL DEFORMATION AMOUNT SENSOR

(75) Inventors: Hisakazu Miyajima, Osaka (JP); Masao Arakawa, Ashiya (JP); Akira Yabuta, Cupertino, CA (US); Jun Sakai, Osaka (JP)

(73) Assignee: Matsushita Electric Works, Ltd., Osaka (JP)

( * ) Notice: Subject to any disclaimer, the term of this patent is extended or adjusted under 35 U.S.C. 154(b) by 0 days.

(21) Appl. No.: 10/446,789

(22) Filed: May 29, 2003

(65) Prior Publication Data

US 2004/0012062 A1 Jan. 22, 2004

(30) Foreign Application Priority Data

Jul. 19, 2002 (JP) ........................................ 2002-211654

(51) Int. Cl.$^7$ ............................. G01L 1/14; G01L 9/04
(52) U.S. Cl. ............... 73/763; 73/862.451; 73/862.471; 73/862.621; 73/862.627; 73/862.632
(58) Field of Search ...................... 73/862.31, 862.391, 73/862.451, 862.471, 862.474, 862.621, 862.625

(56) References Cited

U.S. PATENT DOCUMENTS

| | | | | |
|---|---|---|---|---|
| 4,800,759 A | * | 1/1989 | Hirata et al. ................... | 73/708 |
| 4,813,272 A | * | 3/1989 | Miyazaki et al. .............. | 73/708 |
| 5,635,649 A | * | 6/1997 | Tobita et al. .................. | 73/717 |
| 6,003,381 A | * | 12/1999 | Kato ............................ | 73/721 |
| 6,100,524 A | * | 8/2000 | Yagi et al. ................... | 250/306 |
| 6,146,227 A | * | 11/2000 | Mancevski .................... | 445/24 |

(List continued on next page.)

FOREIGN PATENT DOCUMENTS

| | | | | |
|---|---|---|---|---|
| JP | 62268166 A | * | 11/1987 | ........... H01L/29/84 |
| JP | 11241903 | | 9/1999 | |

OTHER PUBLICATIONS

Hunt et al., "Carbon Nanotube Bimorph Actuators and Force Sensors", Sep. 1, 2001, NASA.*
"IBM Scientists Develop Carbon Nanotube Transistor Technology", Apr. 27, 2001, IBM.*
Tombler et al., "Reversible Electromechanical Characteristics of Carbon Nanotubes Under Local Probe Manipulation" Jun.15, 2000, Nature, vol. 405, pp. 769–772.*
Crespi et al., "In Situ Band Gab Engineering of Carbon Nanotubes", Sep. 15, 1997, Physical Review Letters, vol. 79, No. 11, pp. 2093–2096.*
Stahl et al., "Intertube Coupling in Robes of Single–Wall Carbon Nanotubes", Dec. 11, 2000, Physical Review Letters, vol. 85, No. 24, pp. 5186–5189.*
Collins et al., "Nanotubes for Electronics", Dec. 2000, Scientific American, pp. 62–69.*
English Language Abstract of JP 11–241903.

Primary Examiner—Hezron Williams
Assistant Examiner—David A. Rogers
(74) Attorney, Agent, or Firm—Greenblum & Bernstein, P.L.C.

(57) ABSTRACT

A mechanical deformation amount sensor includes a sensor structure which is formed by a semiconductor substrate or an insulating substrate and integrally includes a deformation portion deformable, when a physical quantity to be detected is applied to the sensor structure, due to the physical quantity and a support portion for supporting the deformation portion, a carbon nanotube resistance element which is provided on the deformation portion so as to be mechanically deformed in response to deformation of the deformation portion and a wiring pattern which is formed in a pattern on the sensor structure so as to be connected to the carbon nanotube resistance element. By applying a voltage to the carbon nanotube resistance element via the wiring pattern, a change of electrical conductivity of the carbon nanotube resistance element upon mechanical deformation of the carbon nanotube resistance element is fetched as an electrical signal.

16 Claims, 13 Drawing Sheets

U.S. PATENT DOCUMENTS

| | | | |
|---|---|---|---|
| 6,150,681 A * | 11/2000 | Allen | 257/254 |
| 6,286,226 B1 * | 9/2001 | Jin | 33/706 |
| 6,515,346 B1 * | 2/2003 | Kemeny | 257/618 |
| 6,550,337 B1 * | 4/2003 | Wagner et al. | 73/715 |
| 6,559,550 B2 * | 5/2003 | Herman | 290/1 R |
| 6,668,652 B2 * | 12/2003 | Nakayama et al. | 73/580 |
| 2001/0028033 A1 * | 10/2001 | Shimizu et al. | 250/309 |
| 2002/0100330 A1 * | 8/2002 | Eickhoff et al. | 73/715 |
| 2002/0122766 A1 * | 9/2002 | Lieber et al. | 423/447.3 |
| 2002/0160111 A1 * | 10/2002 | Sun et al. | 427/248.1 |
| 2002/0174715 A1 * | 11/2002 | Kim et al. | 73/105 |
| 2002/0182542 A1 * | 12/2002 | Choi et al. | 430/296 |
| 2003/0089899 A1 * | 5/2003 | Lieber et al. | 257/9 |
| 2003/0096104 A1 * | 5/2003 | Tobita et al. | 428/332 |
| 2003/0148562 A1 * | 8/2003 | Luyken et al. | 438/197 |
| 2003/0170166 A1 * | 9/2003 | Smalley et al. | 423/447.1 |
| 2004/0001778 A1 * | 1/2004 | Chen et al. | 422/88 |

* cited by examiner

MECHANICAL DEFORMATION AMOUNT SENSOR

BACKGROUND OF THE INVENTION

1. Field of the Invention

The present invention relates to a mechanical deformation amount sensor such as an acceleration sensor, a pressure sensor or the like.

2. Description of the Prior Art

As a sensor for detecting magnitude of a physical quantity to be detected, a mechanical deformation amount sensor is known in which mechanical deformation amount of a sensor structure caused by application of the physical quantity thereto is taken as an index indicative of the magnitude of the physical quantity so as to be converted into an electrical signal. Its typical examples include a semiconductor acceleration sensor and a semiconductor pressure sensor. In the semiconductor acceleration sensor and the semiconductor pressure sensor, the sensor structure is formed by a semiconductor substrate and a phenomenon in which when a stress is applied to a semiconductor crystal, electric resistance of the semiconductor crystal changes, namely, piezoelectric resistance is utilized such that the stress is fetched as the electrical signal.

Meanwhile, a strain sensor employing a carbon nanotube is proposed in, for example, Japanese Patent Laid-Open Publication No. 11-241903 (1999). This known strain sensor is a molded item having a sheetlike or any other predetermined shape, in which electrically conductive fine particles of the carbon nanotube or the like are dispersed in polymer formed by, for example, ethylenevinyl acetate copolymer (EVA). In this known strain sensor, a strain amount is detected by measuring a change of electric resistance, which is caused by extension due to an external force.

In the above described conventional sensor utilizing the piezoelectric resistance, when the sensor structure is formed by working a silicon substrate, the piezoelectric resistance can be formulated by semiconductor diffusion technology in the course of the process for forming the sensor structure, so that the sensor structure can be manufactured by a series of semiconductor substrate working processes advantageously. However, since rate of change of the piezoelectric resistance corresponding to the amount of mechanical deformation of the sensor structure, namely, quantity of change of its electrical conductivity is limited, it is quite difficult to obtain higher sensitivity beyond potential power of the piezoelectric resistance.

Meanwhile, in the above mentioned known strain sensor, since the molded item having the sheetlike or any other predetermined shape obtained by dispersing the electrically conductive fine particles of the carbon nanotube or the like in the polymer is used as a detective resistance element, the combined resistance is increased by contact resistance of the particles, thereby resulting in such a disadvantage as drop of sensitivity. Furthermore, in case the molded item having the sheetlike or any other predetermined shape is used as a mechanical deformation amount detection element, the molded item should be mounted on a structure in which a desired mechanical deformation amount can be detected. However, since it is difficult to mount the molded item on a mechanical deformation portion of the order of several microns, such a problem arises that the strain sensor as a whole becomes large in size.

SUMMARY OF THE INVENTION

Accordingly, an essential object of the present invention is to provide, with a view to eliminating the above mentioned drawbacks of prior art, a mechanical deformation amount sensor such as an acceleration sensor, a pressure sensor or the like, which is capable of achieving higher sensitivity than prior art.

In order to accomplish this object of the present invention, a mechanical deformation amount sensor of the present invention includes a sensor structure which is formed by a semiconductor substrate or an insulating substrate and integrally includes a deformation portion deformable, when a physical quantity to be detected is applied to the sensor structure, due to the physical quantity and a support portion for supporting the deformation portion. A carbon nanotube resistance element is provided on the deformation portion so as to be mechanically deformed in response to deformation of the deformation portion. A wiring pattern is formed in a pattern on the sensor structure so as to be connected to the carbon nanotube resistance element. When a voltage is applied to the carbon nanotube resistance element via the wiring pattern, a change of electrical conductivity of the carbon nanotube resistance element upon mechanical deformation of the carbon nanotube resistance element is fetched as an electrical signal.

By the above described arrangement of the mechanical deformation amount sensor of the present invention, the physical quantity can be detected based on electrical characteristics of the carbon nanotube at higher sensitivity than prior art. Namely, when the physical quantity to be detected by the sensor is applied to the sensor structure in a state where the voltage is applied to the carbon nanotube resistance element via the wiring pattern, the deformation portion is initially deformed and then, the carbon nanotube resistance element is mechanically deformed in response to the deformation of the deformation portion. The carbon nanotube has a property that its electrical conductivity (electric resistance) changes upon its mechanical deformation. Since quantity of change of its electrical conductivity is quite large in comparison with piezoelectric resistance, electrical conductivity of the carbon nanotube resistance element changes rather greatly upon its mechanical deformation, so that quantity of change of voltage or electric current due to the change of the electrical conductivity becomes comparatively large and is fetched, through the wiring pattern, as a highly sensitive electrical signal. Since this electrical signal is used as an index indicative of magnitude of the physical quantity to be detected and is converted into the physical quantity, the physical quantity can be detected at high sensitivity.

In the present invention, if the deformation portion is subjected to mechanical deformation when the physical quantity to be detected is applied to the sensor structure, the deformation portion is not specifically restricted in shape, etc. For example, the deformation portion can be so formed as to be thinner than the support portion and is deformed so as to be deflected elastically when the physical quantity is applied to the sensor structure.

Meanwhile, in the present invention, the sensor structure is preferably a so-called micro-electro-mechanical systems (MEMS) sensor chip formed by micromachining a silicon substrate. In the present invention employing the carbon nanotube which is a quite minute element, the MEMS sensor chip is very advantageous for achieving both high sensitivity and compactness. In this case, the carbon nanotube resistance element is preferably provided on the deformation portion through an insulating film.

Meanwhile, in the present invention, the carbon nanotube resistance element is preferably disposed such that a longitudinal direction of the carbon nanotube resistance element is orthogonal to a direction of deformation of the deformation portion. The carbon nanotube has a property that its electrical conductivity changes upon its deformation in a direction orthogonal to its longitudinal direction. Since the longitudinal direction of the carbon nanotube resistance element is orthogonal to the direction of deformation of the deformation portion, deformation of the deformation portion is reflected most precisely in deformation of the carbon nanotube resistance element. As a result, change of electrical conductivity of the carbon nanotube resistance element increases accordingly, which is advantageous for achieving high sensitivity.

Meanwhile, in the present invention, the wiring pattern may have, at its end portion connected to the carbon nanotube resistance element, a metal electrode such that each of opposite end portions of the carbon nanotube resistance element is covered by the metal electrode. Thus, the carbon nanotube resistance element can be positively connected to the wiring pattern by the metal pattern and the carbon nanotube resistance element can be securely fixed to the deformation portion.

Meanwhile, in the present invention, a surface of the carbon nanotube resistance element is preferably covered by an insulating coating film. This is because the insulating coating film can not only protect the carbon nanotube resistance element but fix the carbon nanotube resistance element to the deformation portion more securely. In this case, the insulating coating film may be formed by a passivation film provided on a surface of the sensor structure so as to not only protect the surface of the sensor structure but protect and fix the carbon nanotube resistance element.

Meanwhile, in the present invention, it is preferable that a step portion is formed on the deformation portion and the carbon nanotube resistance element is provided on the deformation portion so as to stride over the step portion. Thus, by utilizing a feature of the carbon nanotube that change of its electrical conductivity at its portion having a large angle of deformation is large as compared with a case in which the carbon nanotube resistance element is provided on a flat face, a large change of electrical conductivity can be obtained in response to a small deformation amount and thus, higher sensitivity can be achieved.

Meanwhile, in the present invention, it is preferable that a reference resistance element is provided at a portion of the sensor structure other than the deformation portion and the reference resistance element and the carbon nanotube resistance element are connected to each other by the wiring pattern so as to form a bridge circuit. In this case, a voltage is applied to an input terminal of the bridge circuit and a voltage of an output terminal of the bridge circuit can be fetched as an electrical signal corresponding to a change of electrical conductivity of the carbon nanotube resistance element upon mechanical deformation of the carbon nanotube resistance element, so that high sensitivity can be gained and detection accuracy is improved. In this case, the reference resistance element is preferably formed by a carbon nanotube. When both the detective resistance element and the reference resistance element are identically formed by the carbon nanotubes, detection accuracy is improved further.

Meanwhile, in the present invention, the carbon nanotube resistance element is preferably formed by a single-wall carbon nanotube. This is because change of electrical conductivity of the single-wall carbon nanotube upon its deformation in the direction orthogonal to its longitudinal direction is larger than that of a multi-wall carbon nanotube advantageously for higher sensitivity. In this case, it is preferable that the carbon nanotube resistance element is formed by a plurality of the single-wall carbon nanotubes which are arranged side by side and are electrically connected to each other in parallel. Thus, since scattering degrees of change of electrical conductivity of the respective single-wall carbon nanotubes are averaged so as to be restrained, not only high sensitivity can be gained but detection accuracy can be improved.

Furthermore, in the present invention, an acceleration sensor having an acceleration as the physical quantity to be detected is provided as one concrete example of the mechanical deformation amount sensor. In the acceleration sensor, the sensor structure further includes a weight portion integrally coupled with the support portion by the deformation portion.

Moreover, in the present invention, a pressure sensor having a fluid pressure as the physical quantity to be detected is provided as another concrete example of the mechanical deformation amount sensor. In the sensor structure of the pressure sensor, the support portion is formed in a shape of a frame and the deformation portion is formed by a diaphragm occupying an inside space of the frame of the support portion such that the diaphragm bears the fluid pressure. In this case, the carbon nanotube resistance element is preferably provided at a peripheral edge portion of the diaphragm.

BRIEF DESCRIPTION OF THE DRAWINGS

This object and features of the present invention will become apparent from the following description taken in conjunction with the preferred embodiments thereof with reference to the accompanying drawings in which.

Before the description of the present invention proceeds, it is to be noted that like parts are designated by like reference numerals throughout several views of the accompanying drawings.

DETAILED DESCRIPTION OF THE INVENTION

Hereinafter, mechanical deformation amount sensors according to embodiments of the present invention are described with reference to the drawings.

First Embodiment

Figure 1:
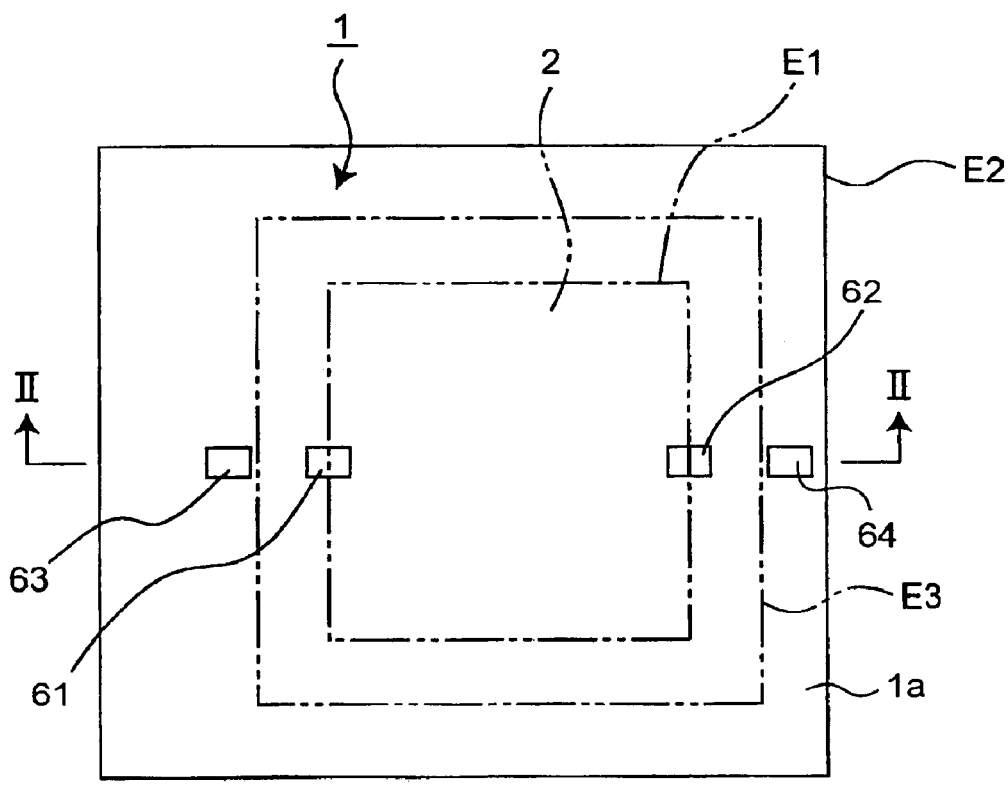
FIG. 1 is a top plan view of a pressure sensor according to a first embodiment of the present invention.
Figure 2:
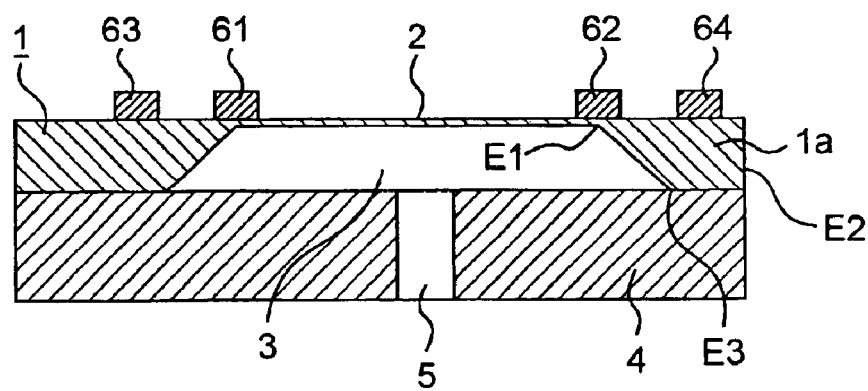
FIG. 2 is a sectional view taken along the line II—II in FIG. 1.

As shown in FIGS. 1 and 2, a mechanical deformation amount sensor according to a first embodiment acts as a pressure sensor for detecting fluid pressure. In this embodiment, a sensor structure 1 is a so-called micro-electro-mechanical systems (MEMS) sensor chip (semiconductor pressure sensor chip) obtained by working a silicon substrate and is constituted by a support portion 1a having a shape of a rectangular frame and a thin-walled diaphragm 2 occupying an inside space of the frame of the support portion 1a. In this pressure sensor chip 1, the diaphragm 2 acting as a thin-walled pressure bearing portion is formed by digging a recess 3 into a portion of a rear face of the pressure sensor chip 1 by anisotropic etching such that a bottom wall of the recess 3, namely, the diaphragm 2 has a predetermined thickness. Thus, as shown in FIG. 1, the support portion 1a has three rectangular frame edges, i.e., an innermost rectangular frame edge E1 bounding the diaphragm 2, an outermost rectangular frame edge E2 defining an outer contour of the sensor structure 1 and an intermediate rectangular frame edge E3 defining a contour of a mouth of the recess 3. A base 4 made of glass and having a pressure introduction bore 5 for introducing the fluid pressure into the recess 3 is secured to the rear face of the pressure sensor chip 1. In the pressure sensor chip 1, when the fluid pressure is introduced from the pressure introduction bore 5 into the recess 3, the diaphragm 2 is deformed so as to be deflected.

In order to fetch as an electrical signal a deformation amount of the diaphragm 2 in accordance with magnitude of the fluid pressure, carbon nanotube resistance elements 61 and 62 are provided on a front face of the diaphragm 2. Each of the carbon nanotube resistance elements 61 and 62 is provided and fixed at a central location of each of opposite sides of the innermost rectangular frame edge E1 of the support portion 1a in a peripheral edge portion of the diaphragm 2 such that axes of the carbon nanotube resistance elements 61 and 62 are aligned with each other. A carbon nanotube has such a property that when the carbon nanotube is deformed in a direction perpendicular to an axial or longitudinal direction of the carbon nanotube, electrical conductivity (electric resistance) of the carbon nanotube changes in accordance with the deformation amount. On the other hand, deflective deformation of the diaphragm 2 is produced in a thickness direction of the substrate. Hence, since the axial direction of the carbon nanotube is orthogonal to the direction of deflective deformation of the diaphragm 2 by the above described arrangement of the carbon nanotube resistance elements 61 and 62, deflective deformation of the diaphragm 2 is efficiently transmitted to the carbon nanotube resistance elements 61 and 62 and thus, change of electrical conductivity of the carbon nanotube increases. Meanwhile, since the carbon nanotube resistance elements 61 and 62 are also provided in the peripheral edge portion of the diaphragm 2, whose deflective deformation is large, deflective deformation of the diaphragm 2 is efficiently transmitted to the carbon nanotube resistance elements 61 and 62, thereby resulting in increase of change of electrical conductivity of the carbon nanotube.

An overall length of the carbon nanotube resistance elements 61 and 62 may be placed on the diaphragm 2. However, in this embodiment, each of the carbon nanotube resistance elements 61 and 62 is disposed so as to stride over, at its longitudinal middle portion, the boundary E1 of the diaphragm 2 and the support portion 1a such that a substantially half portion of each of the carbon nanotube resistance elements 61 and 62 are placed on the diaphragm 2. This is because the diaphragm 2 is subjected to large deflective deformation in the neighborhood of the boundary E1 of the diaphragm 2 and the support portion 1a so as to flex.

Figure 3:
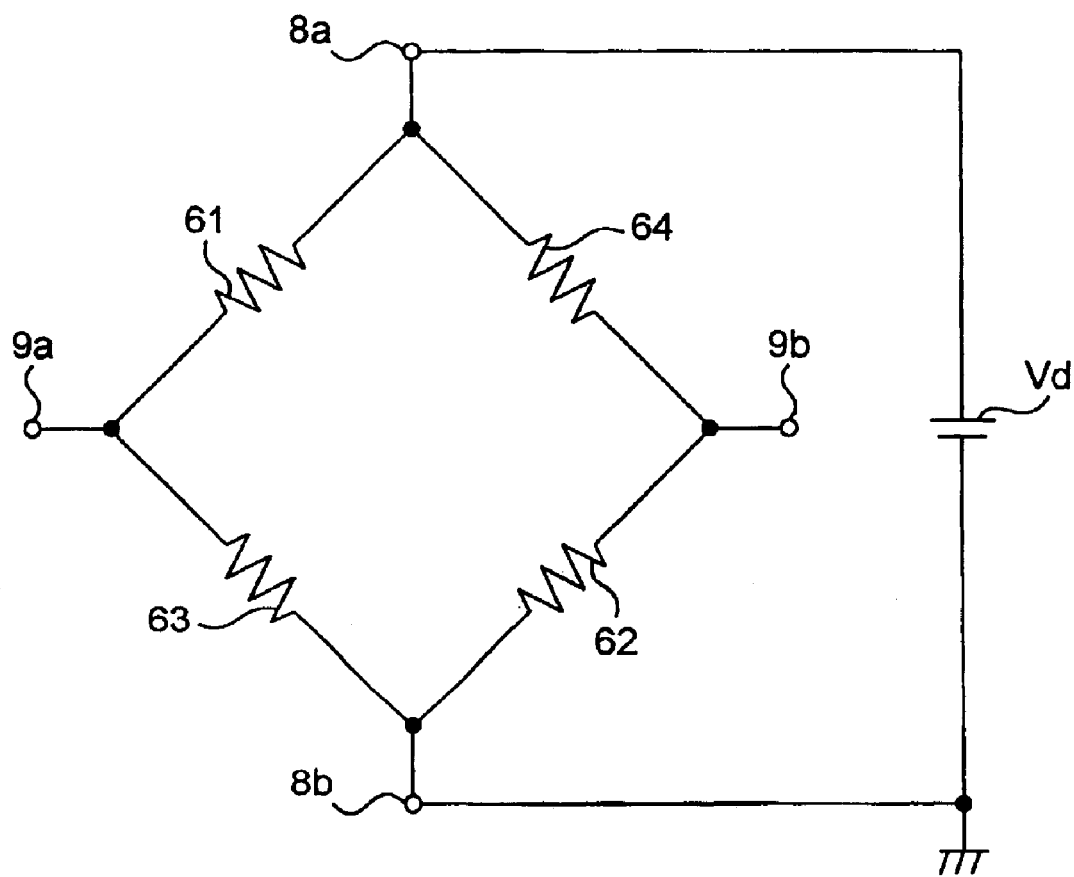
FIG. 3 is a circuit diagram of a bridge circuit for fetching a detection signal, employed in the pressure sensor of FIG. 1.

Meanwhile, as shown in FIG. 3, a bridge circuit for fetching a detection signal as shown in FIG. 3 is formed by the carbon nanotube resistance elements 61 and 62 and reference resistance elements 63 and 64. Each of the reference resistance elements 63 and 64 is provided and fixed on the front face of the support portion 1a which is not deformed by the fluid pressure such that axes of the reference resistance elements 63 and 64 are aligned with those of the carbon nanotube resistance elements 61 and 62. Carbon nanotubes are used as material of the reference resistance elements 63 and 64. The resistance elements 61 to 64 made of the carbon nanotubes are formed so as to have an identical electric resistance when no pressure is applied to the diaphragm 2. By using the carbon nanotubes as the material of the resistance elements 61 to 64 identically and imparting the identical electric resistance to the resistance elements 61 to 64, detection accuracy of the bridge circuit is improved.

In the bridge circuit, the carbon nanotube resistance elements 61 and 62 which are deformed in response to deformation of the diaphragm 2 are, respectively, disposed on a pair of the opposite sides of the innermost rectangular frame edge E1 of the support portion 1a, while the reference resistance elements 63 and 64 are, respectively, provided outside a pair of opposite sides of the intermediate rectangular frame edge E3 of the support portion 1a. A DC voltage Vd is applied between a junction 8a of the carbon nanotube resistance element 61 and the reference resistance element 64 and a junction 8b of the carbon nanotube resistance element 62 and the reference resistance element 63 such that a potential difference between a junction 9a of the carbon nanotube resistance element 61 and the reference resistance element 63 and a junction 9b of the carbon nanotube resistance element 62 and the reference resistance element 64 is fetched as the detection signal.

Figure 4:
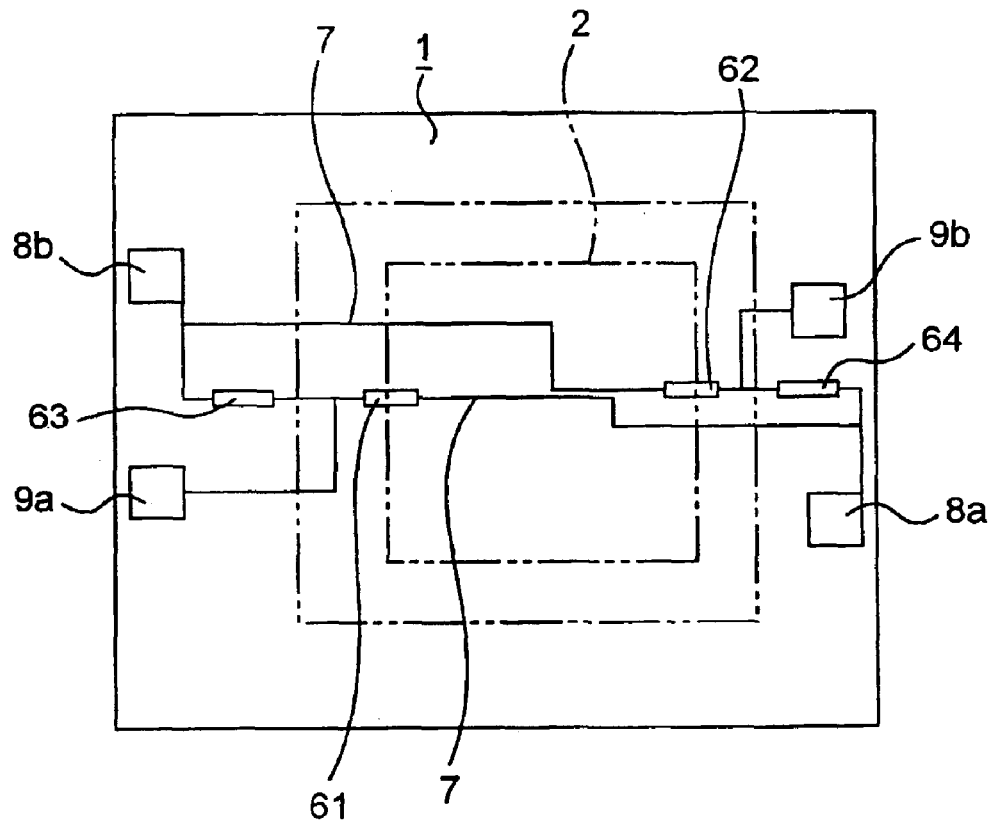
FIG. 4 is a view explanatory of layout of electrodes and a metal wire in the bridge circuit of FIG. 3.

FIG. 4 shows, as an example, a wiring pattern 7 for connecting the resistance elements 61 to 64 so as to form the bridge circuit. In this example, the wiring pattern 7 is formed on the surface of the sensor structure 1 including the diaphragm 2, while electrode pads for the input terminals 8a and 8b for applying the DC voltage Vd to the bridge circuit and electrode pads for the output terminals 9a and 9b for fetching the detection signal are provided on the surface of the support portion 1a. The wiring pattern 7 can be formed by a metal wire such as aluminum but may also be formed through diffusion wiring by doping the silicon substrate acting as the pressure sensor chip 1. Alternatively, the wiring pattern may be formed by combination of the above two procedures.

Figure 5:
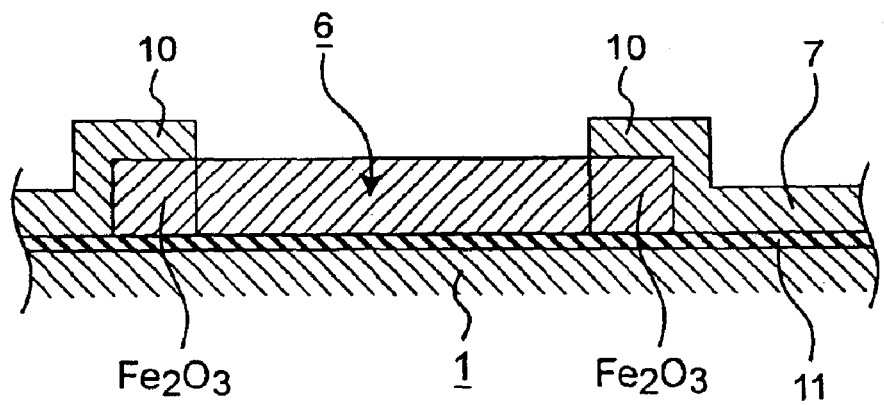
FIG. 5 is a sectional view explanatory of one fixing layout of a carbon nanotube used for the bridge circuit of FIG. 3.

FIG. 5 schematically shows a layout of a carbon nanotube 6 for forming the carbon nanotube resistance elements 61 and 62 and the reference resistance elements 63 and 64. As shown in FIG. 5, the carbon nanotube 6 is a rodlike minute structure and is connected, at its opposite end portions, to the wiring pattern 7. In order to form the carbon nanotube 6 at a predetermined location on the surface of the sensor structure 1, a method in which a carbon nanotube formed already into a rodlike shape is provided and fixed at the predetermined location and a method in which a carbon nanotube is grown at the predetermined location on the surface of the sensor structure 1 may be employed. In the former method, a commercially available carbon nanotube can be used, but the sensor structure 1 is minute and the size of the carbon nanotube itself is quite small, so that handling of the carbon nanotube is not so easy. Hence, the latter method is preferably employed. In the latter method, one metal, such as iron, nickel and cobalt or its compound is used as a catalyst and the carbon nanotube is formed at the predetermined location by using the catalyst as a starting point. For example, in FIG. 5, at the location for providing the carbon nanotube 6 on the surface of the pressure sensor chip 1, ferric oxide ($Fe_2O_3$) is formed, as catalytic portions, at portions corresponding to opposite end portions of the carbon nanotube 6, such that the carbon nanotube 6 is formed between the catalytic portions by such processes as CVD and arc discharge. In order to form the catalytic portions, resist patterning, for example, is performed on the surface of the pressure sensor chip 1 so as to deposit, sputter, drip or spin coat the catalytic material. Meanwhile, in order to form the carbon nanotube 6, CVD or arc discharge is performed at a temperature of 500 to 1,000° C. while a mixed gas composed of hydrocarbon gas, such as methane and hydrogen gas, is delivered in a direction for forming the carbon nanotube 6.

Carbon nanotubes are roughly classified into a single-wall carbon nanotube (SWNT) and a multi-wall carbon nanotube (MWNT). The single-wall carbon nanotube is a cylindrical substance formed by a single graphite sheet. On the other hand, the multi-wall carbon nanotube is a cylindrical substance formed by a plurality of graphite sheets provided concentrically or in a scroll. The carbon nanotube 6 employed in the present invention is preferably the single-wall carbon nanotube but may also be the multi-wall carbon nanotube. However, since change of electrical conductivity of the single-wall carbon nanotube upon its deformation in the direction orthogonal to the longitudinal direction is larger than that of the multi-wall carbon nanotube, the single-wall carbon nanotube is more advantageous for achieving high sensitivity than the multi-wall carbon nanotube. In this embodiment, each of the resistance elements 61 to 64 employing the carbon nanotubes 6 is formed by a plurality of single-wall carbon nanotubes which are arranged side by side and are electrically connected to each other in parallel. As a result, since scattering degrees of change of the electrical conductivity of the respective single-wall carbon nanotubes are averaged so as to be restrained, not only high sensitivity can be gained but detection accuracy can be improved.

In this embodiment, each of the opposite end portions of the carbon nanotube 6 is covered by a metal electrode 10 extending from the wiring pattern 7 and made of aluminum or titanium/gold. By providing the metal electrode 10, the opposite end portions of the carbon nanotube 6 and the wiring pattern 7 can be connected to each other positively. In addition, since the metal electrode 10 grips each of the opposite end portions of the carbon nanotube 6, the carbon nanotube 6 is firmly fixed so as to be prevented from being removed from the predetermined location on the surface of the chip 1.

Figure 6:
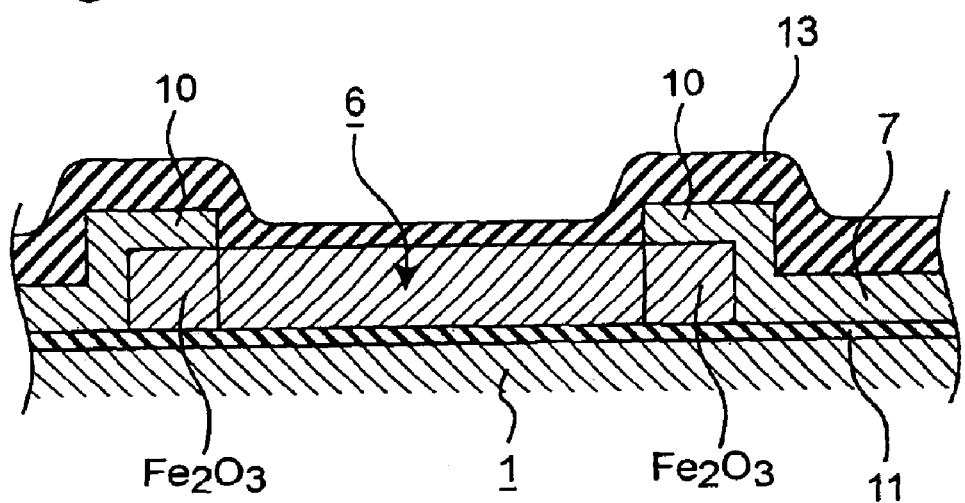
FIG. 6 is a sectional view explanatory of another fixing layout of the carbon nanotube of FIG. 5.

In this embodiment, a surface of the carbon nanotube 6 may also be covered by an insulating coating film 13 as shown in FIG. 6. The insulating coating film 13 protects the carbon nanotube 6 and secures the carbon nanotube 6 to the pressure sensor chip 1 more firmly. The insulating coating film 13 may be provided so as to cover the carbon nanotube 6 spottily. However, a passivation film provided on the surface of the pressure sensor chip 1 may be used as the insulating coating film 13. Thus, the insulating coating film 13 not only protects the surface of the sensor chip 1, but protects and secures the carbon nanotube 6. As shown in FIG. 6, an insulating film 11 made of silicon dioxide ($SiO_2$) or the like is provided on the surface of the pressure sensor chip 1 formed by the silicon substrate and the carbon nanotube 6 and the metal wire of the wiring pattern 7 are provided on the insulating film 11. In case the wiring pattern 7 includes a portion formed by diffusion wiring, the portion of the diffusion wiring is disposed in the pressure sensor chip 1 under the insulating film 11 but may be electrically conducted to a surface of the insulating film 11 by forming a contact hole at a desired location of the insulating film 1.

Figure 7:
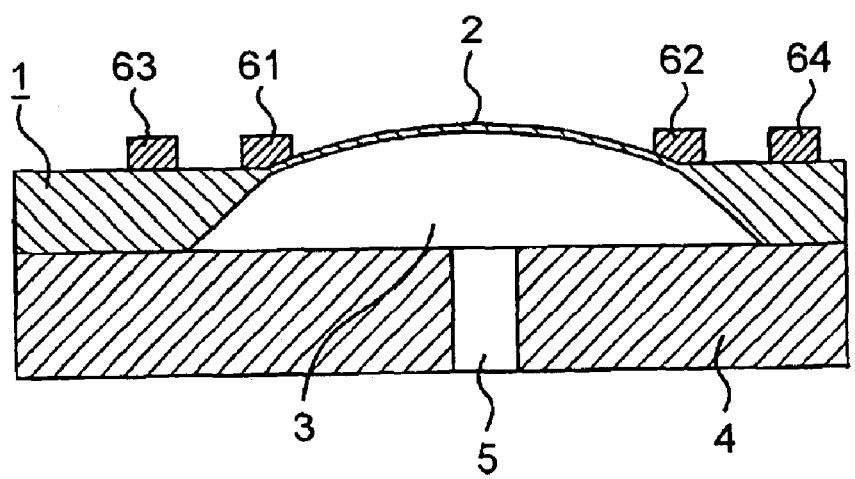
FIG. 7 is a view similar to FIG. 2, particularly showing operation of the pressure sensor of FIG. 1.

In the semiconductor pressure sensor of the first embodiment, when no fluid pressure is introduced into the recess 3 from the pressure introduction bore 5 of the base 4, potential difference between the output terminals 9a and 9b of the bridge circuit is zero. However, if fluid pressure is introduced into the recess 3 from the pressure introduction bore 5 of the base 4, a central portion of the diaphragm 2 is deflected by the fluid pressure so as to be expanded upwardly as shown in FIG. 7 and the peripheral edge portion of the diaphragm 2 is deformed so as to be pulled obliquely upwardly. Thus, the carbon nanotube resistance elements 61 and 62 fixed at the peripheral edge portion of the diaphragm 2 are subjected to compressive deformation in the direction orthogonal to the axial direction of the carbon nanotube resistance elements 61 and 62, namely, in a direction of small modulus of elasticity in response to deformation of the peripheral edge portion of the diaphragm 2. By this compressive deformation of the carbon nanotube resistances elements 61 and 62, electric resistance, i.e., electrical conductivity between the carbon nanotube resistance elements 61 and 62 changes in accordance with amount of the compressive deformation and a potential difference corresponding to the change of the electric resistance is generated between the output terminals 9a and 9b of the bridge circuit. Namely, since a magnitude of this potential difference corresponds to a magnitude of the fluid pressure applied to the diaphragm 2, the fluid pressure can be detected from this potential difference.

Second Embodiment

Figure 8:
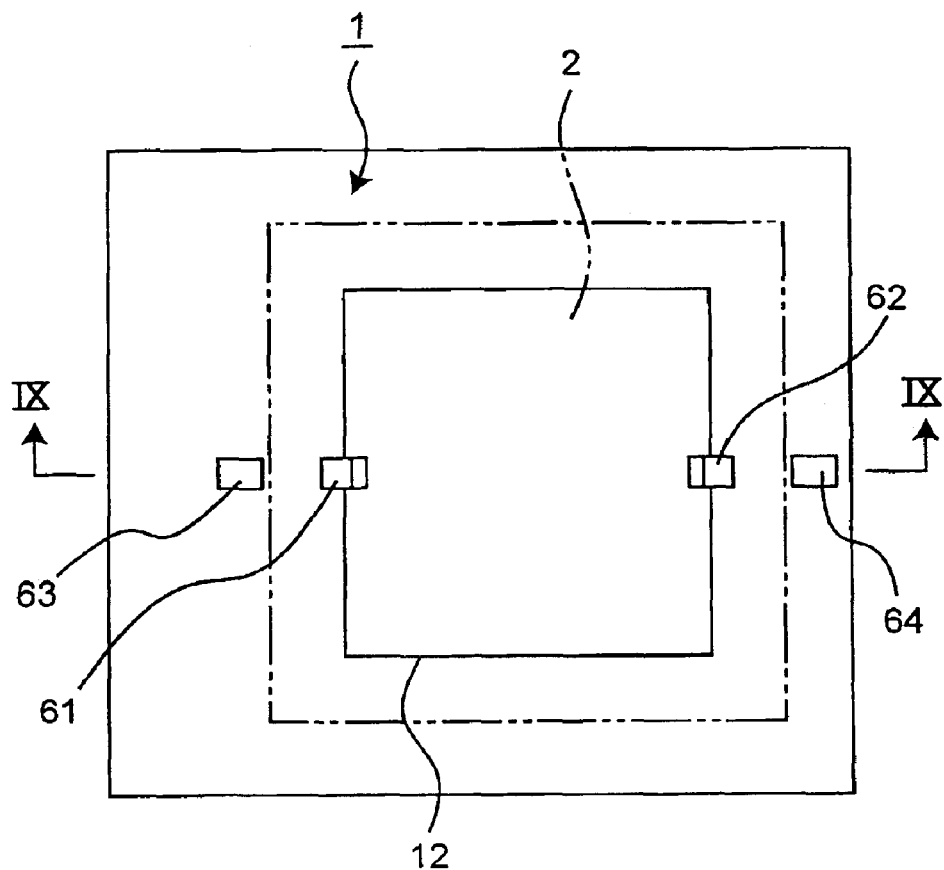
FIG. 8 is a top plan view of a pressure sensor according to a second embodiment of the present invention.
Figure 9:
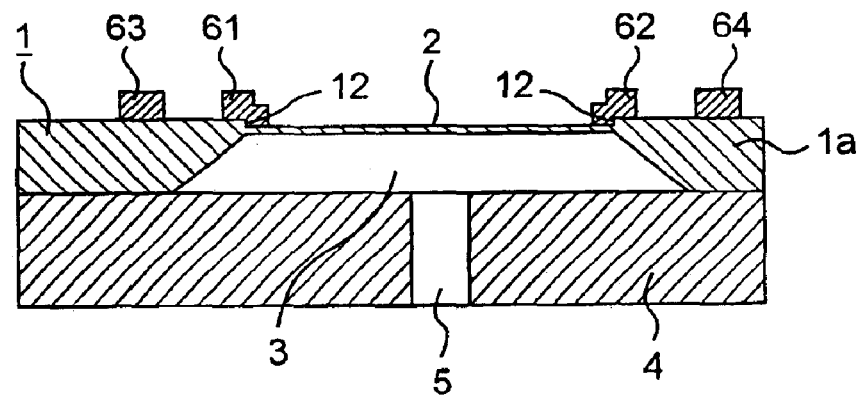
FIG. 9 is a sectional view taken along the line IX—IX in FIG. 8.

FIGS. 8 and 9 show a semiconductor pressure sensor according to a second embodiment of the present invention.

In the first embodiment, a surface of the pressure sensor chip 1 including the diaphragm 2 is flat and the carbon nanotube resistance elements 61 and 62 are arranged and fixed on this flat surface of the pressure sensor chip 1. The second embodiment is designed to make the best use of such a property of a carbon nanotube that electric resistance of the carbon nanotube changes greatly at its location having a large angle of deformation.

Namely, in this embodiment, a step portion 12 is formed at a boundary of the peripheral edge portion, i.e., a deformation portion of the diaphragm 2 and the support portion 1a as shown in FIG. 9 such that a surface of the diaphragm 2 is set lower than that of the support portion 1a surrounding the diaphragm 2. Each of the carbon nanotube resistance elements 61 and 62 is disposed and fixed so as to longitudinally stride over the step portion 12 and is bent from the surface of the support portion 1a to the surface of the diaphragm 2 along a vertical surface of the step portion 12. Since other constructions of the semiconductor pressure sensor of this embodiment are similar to those of the pressure sensor of the first embodiment, the description is abbreviated for the sake of brevity.

Figure 10:
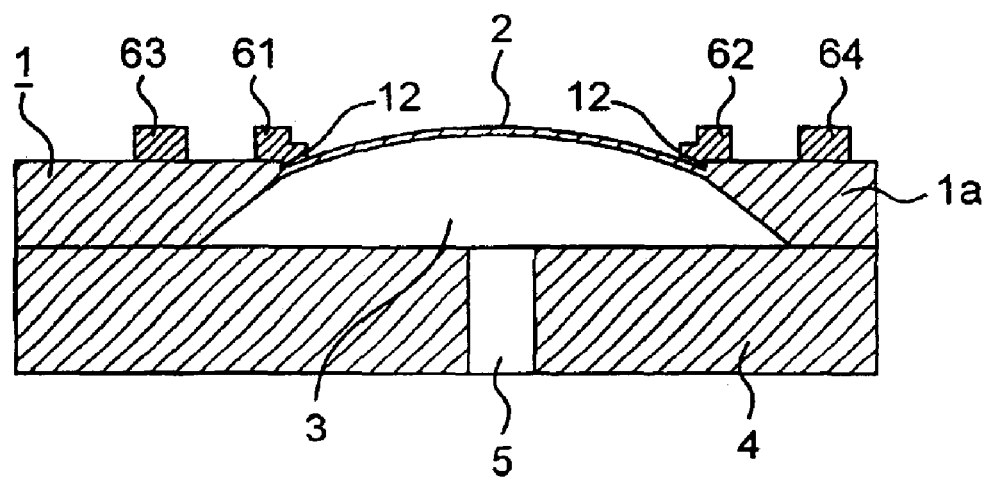
FIG. 10 is a view similar to FIG. 9, particularly showing operation of the pressure sensor of FIG. 8.

In the semiconductor pressure sensor, when fluid pressure is introduced into the recess 3 from the pressure introduction bore 5 of the base 4, a central portion of the diaphragm 2 is deflected by the fluid pressure so as to be expanded upwardly and the peripheral edge portion of the diaphragm 2 is deformed so as to be pulled obliquely upwardly as shown in FIG. 10. Thus, each of the carbon nanotube resistance elements 61 and 62 secured to the step portion 12 in the peripheral edge portion of the diaphragm 2 is subjected to compressive deformation in a direction orthogonal to its axial or longitudinal direction, i.e., in a direction of small modulus of elasticity in response to deformation of the peripheral edge portion of the diaphragm 2. At this time, since a portion of each of the carbon nanotube resistance elements 61 and 62, which is disposed at the step portion 12, is subjected to compressive deformation at a large angle, electric resistance (electrical conductivity) between opposite ends of each of the carbon nanotube resistance elements 61 and 62 changes greatly and thus, the potential difference between the output terminals 9a and 9b of the bridge circuit also becomes large. Namely, since a large-level electrical signal can be obtained by the small deformation amount, the fluid pressure can be detected at high sensitivity.

Third Embodiment

Figure 11:
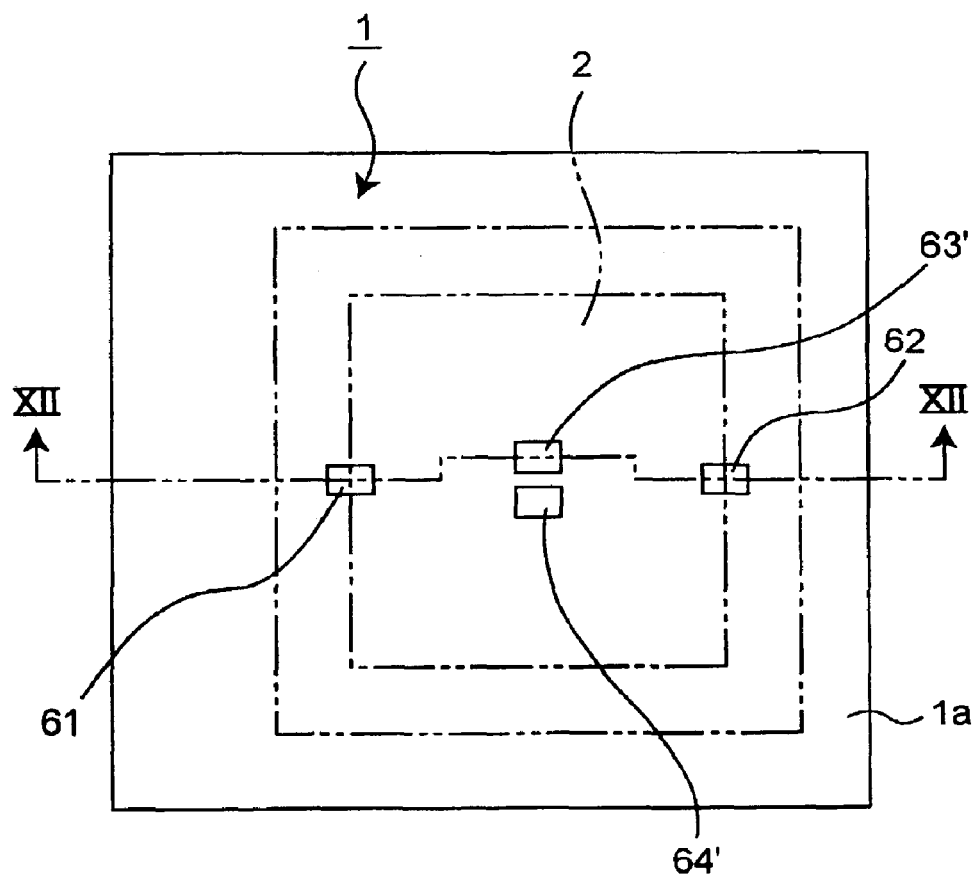
FIG. 11 is a top plan view of a pressure sensor according to a third embodiment of the present invention.
Figure 12:
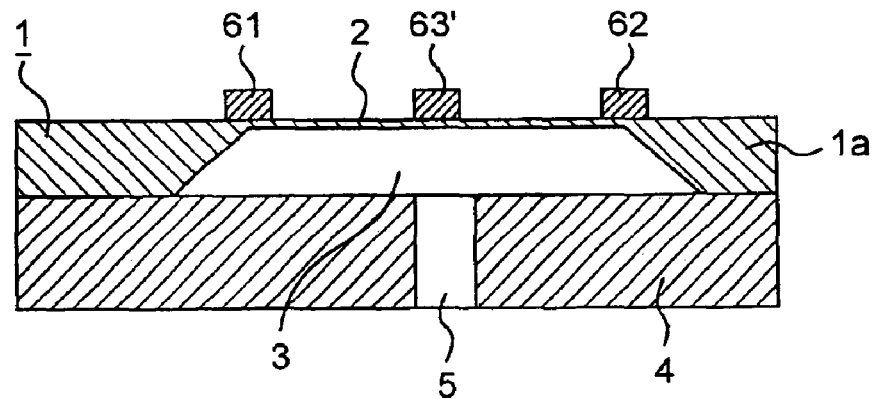
FIG. 12 is a sectional view taken along the line XII—XII in FIG. 11.
Figure 13:
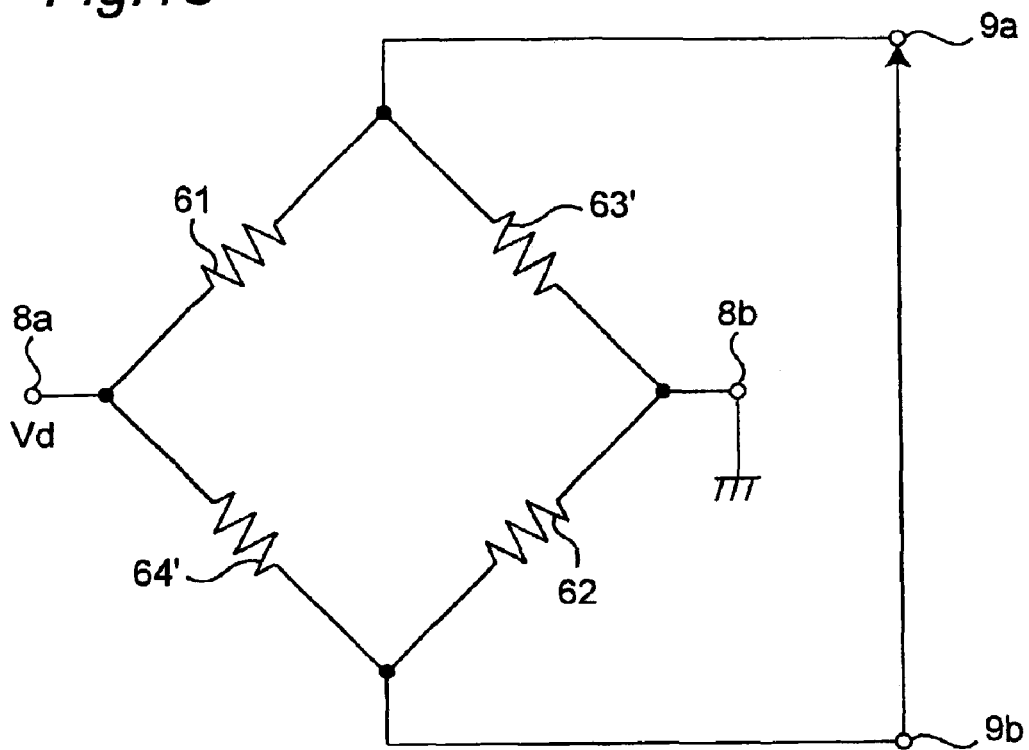
FIG. 13 is a circuit diagram of a bridge circuit for fetching a detection signal, employed in the pressure sensor of FIG. 11.

FIGS. 11 and 12 show a semiconductor pressure sensor according to a third embodiment of the present invention. In the first and second embodiments, the bridge circuit is formed by providing the reference resistance elements 63 and 64. In this embodiment, reference resistance elements 63' and 64' are provided at a central portion of a surface of the diaphragm 2 such that an axial direction of the reference resistance elements 63' and 64' is parallel to that of the carbon nanotube resistance elements 61 and 62 disposed in the peripheral edge portion of the diaphragm 2 and a bridge circuit shown in FIG. 13 is formed by using the reference resistance elements 63' and 64'. The reference resistance elements 63' and 64' are constituted by carbon nanotubes.

Figure 14:
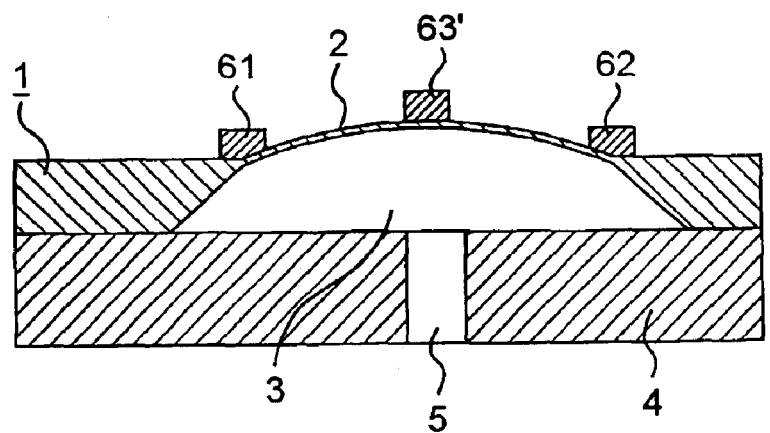
FIG. 14 is a view similar to FIG. 12, particularly showing operation of the pressure sensor of FIG. 11.

In the semiconductor pressure sensor, when fluid pressure is introduced into the recess 3 from the pressure introduction bore 5 of the base 4, a central portion of the diaphragm 2 is deflected by the fluid pressure so as to be expanded upwardly and the peripheral edge portion of the diaphragm 2 is deformed so as to be pulled obliquely upwardly as shown in FIG. 14. Thus, the reference resistance elements 63' and 64' disposed at the central portion of the diaphragm 2 are deformed so as to be stretched, while the carbon nanotube resistance elements 61 and 62 fixed at the peripheral edge portion of the diaphragm 2 are subjected to compressive deformation in a direction orthogonal to an axial direction of the carbon nanotube resistance elements 61 and 62, i.e., in a direction of small modulus of elasticity in response to deformation of the peripheral edge portion of the diaphragm 2. Namely, a direction of change of electric resistance of the carbon nanotube resistance elements 61 and 62 is opposite to that of the reference resistance elements 63' and 64'.

Thus, potential difference produced between the output terminals 9a and 9b of the bridge circuit becomes larger than that of the first embodiment. Namely, since a large-level electrical signal can be obtained by the small deformation amount, the fluid pressure can be detected at high sensitivity.

Fourth Embodiment

Figure 15:
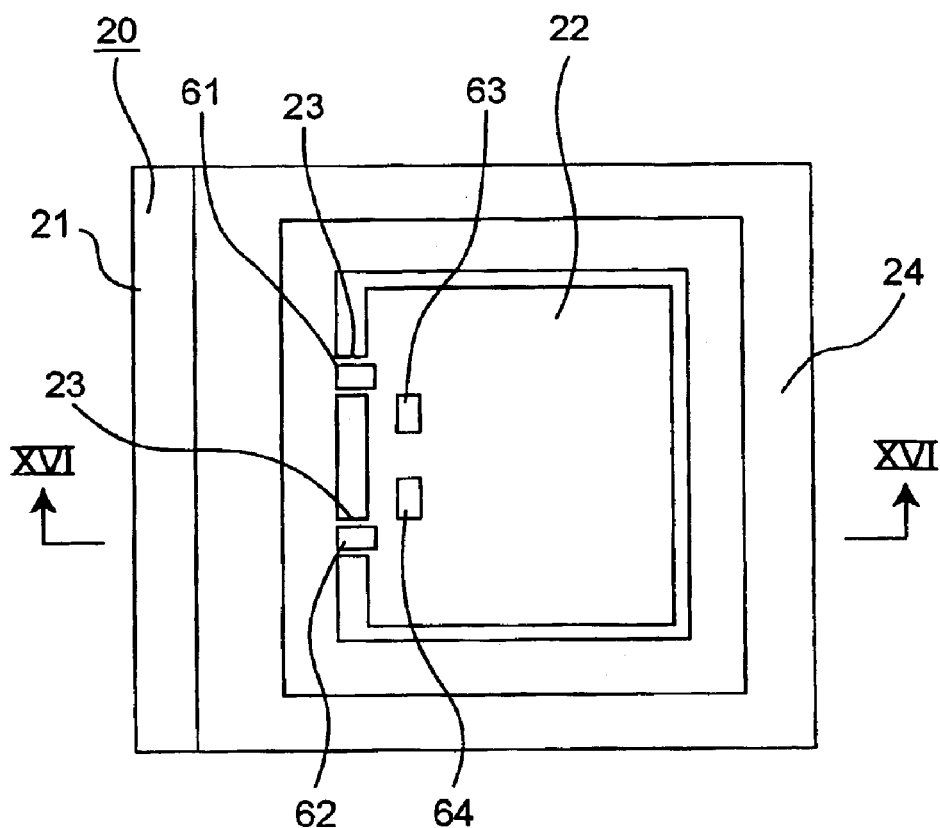
FIG. 15 is a top plan view of an acceleration sensor according to a fourth embodiment of the present invention, with its upper glass cap being removed therefrom.
Figure 16:
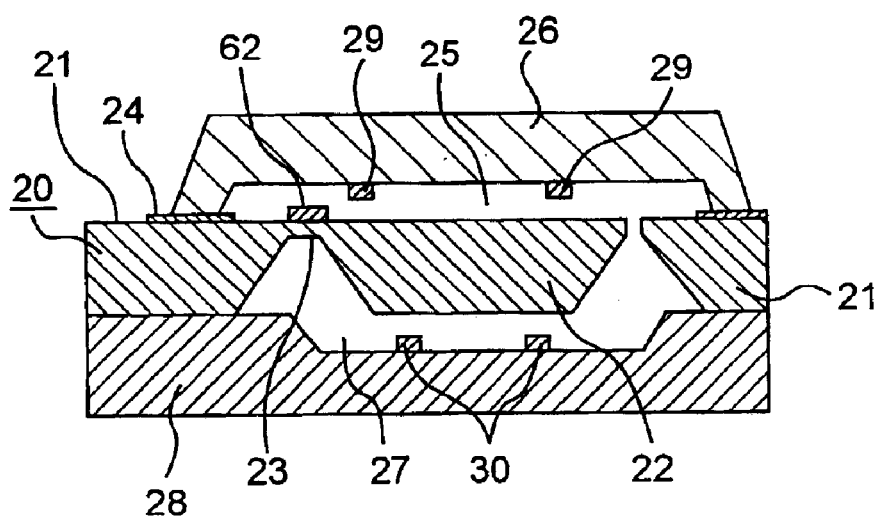
FIG. 16 is a sectional view taken along the line XVI—XVI in FIG. 15, with the upper glass cap being provided.

FIGS. 15 and 16 show an acceleration sensor according to a fourth embodiment of the present invention. In the first to third embodiments, the mechanical deformation amount sensor acts as the pressure sensor. On the other hand, in this embodiment, the mechanical deformation amount sensor acts as the acceleration sensor. By performing micromachining such as etching on a silicon substrate as shown in FIG. 15, an acceleration sensor chip 20 is formed. This acceleration sensor chip 20 includes a frame-like support portion 21 and a weight portion 22 whose one side is integrally attached to the support portion 21 by a pair of parallel beam portions 23. The weight portion 22 is pivotally provided in a space surrounded by the support portion 21. As shown in FIG. 16, a metallic film 24 is provided on an upper surface of the support portion 21 along an outer peripheral portion of the acceleration sensor chip 20. An upper glass cap 26 formed, on its underside, with a recess 25 enabling upward movement of the weight portion 22 is provided on an upside of the acceleration sensor chip 20. The underside of this upper glass cap 26 is bonded to the outer peripheral portion of the upside of the acceleration sensor chip 20 via the metallic film 24.

A lower glass cap 28 formed, on its upside, with a recess 27 enabling downward movement of the weight portion 22 is secured to an underside of the acceleration sensor chip 20. An outer peripheral portion of an upside of the lower glass cap 28 is bonded to the underside of the support portion 21 of the acceleration sensor chip 20 by anodic bonding.

The carbon nanotube resistance elements 61 and 62 are fixed to the beam portions 23 acting as a deformation portion which is deformed by pivotal movement of the weight portion 22. The carbon nanotube resistance elements 61 and 62 are disposed so as to axially or longitudinally stride over the beam portions 23 and the weight portion 22 such that an axial direction of the carbon nanotube resistance elements 61 and 62 is orthogonal to a direction of deformation of the beam portions 23. Meanwhile, the reference resistance elements 63 and 64 formed by carbon nanotubes are secured to an upside of the weight portion 22 so as to axially extend orthogonally to the axial direction of the carbon nanotube resistance elements 61 and 62. The resistance elements 61 to 64 are fixed to the acceleration sensor chip 20 in the same manner as the first embodiment. Meanwhile, although a metal wire for effecting bridge connection of the resistance elements 61 to 64 in the same manner as FIG. 3 is formed on the surface of the support portion 21, the weight portion 22 and the beam portions 23 and input and output electrodes of the bridge circuit are formed on the surface of the support portion 21, these circuit components are abbreviated in FIGS. 15 and 16. In FIG. 16, stoppers 29 and 30 for restraining movement of the weight portion 22 are, respectively, provided on the upper glass cap 26 and the lower glass cap 28.

Figure 17:
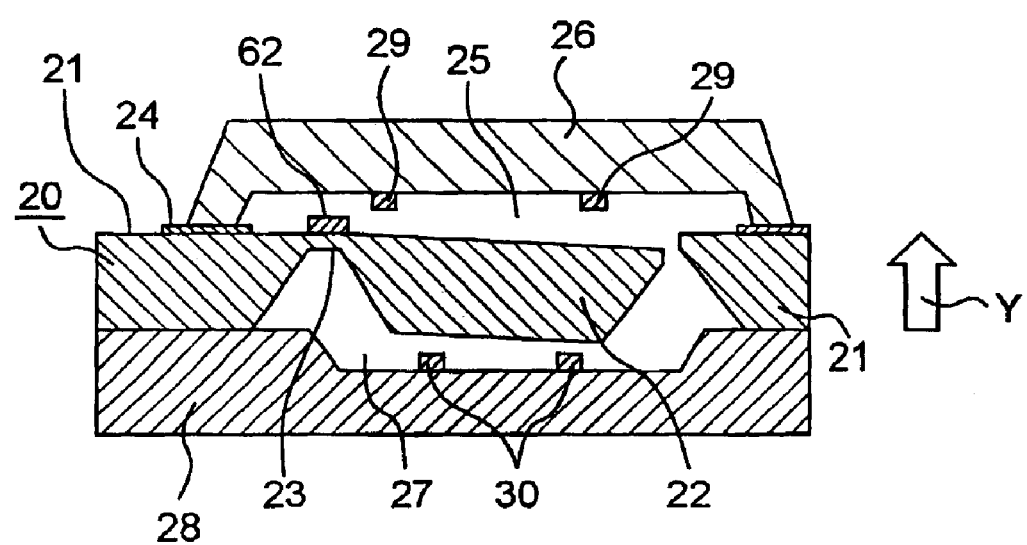
FIG. 17 is a view similar to FIG. 16, particularly showing operation of the acceleration sensor of FIG. 15.

If an acceleration is applied to the acceleration sensor in the direction of the arrow Y as shown in FIG. 17, a force corresponding to the acceleration is applied to the weight portion 22 so as to pivot the weight portion 22 as shown. By this pivotal movement of the weight portion 22, the beam portions 23 for coupling the support portion 21 and the weight portion 22 with each other are subjected to deflective deformation and thus, the carbon nanotube resistance elements 61 and 62 are also deformed in response to this deflective deformation of the beam portions 23.

A deformation amount of the carbon nanotube resistance elements 61 and 62 corresponds to a magnitude of the acceleration and electric resistance (electrical conductivity) between opposite ends of the carbon nanotube resistance elements 61 and 62 changes in response to this deformation amount. Thus, potential difference corresponding to the change of electric resistance is produced between the output terminals 9a and 9b of the bridge circuit shown in FIG. 3. Namely, since magnitude of this potential difference corresponds to magnitude of the acceleration applied to the weight portion 22, the acceleration can be detected from the potential difference.

Fifth Embodiment

Figure 18:
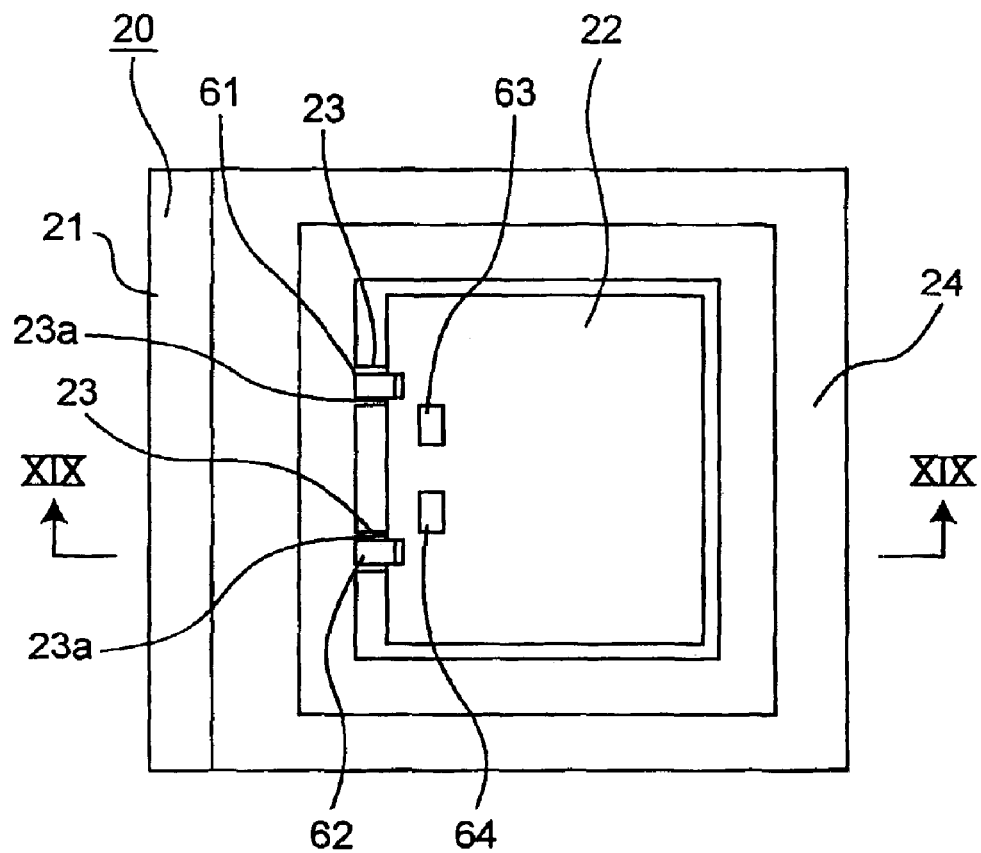
FIG. 18 is a top plan view of an acceleration sensor according to a fifth embodiment of the present invention, with its upper glass cap being removed therefrom.
Figure 19:
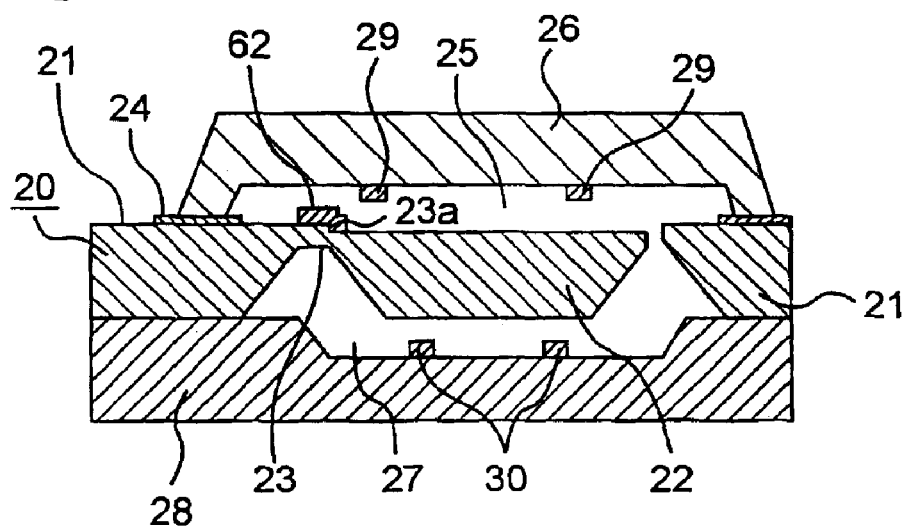
FIG. 19 is a sectional view taken along the line XIX—XIX in FIG. 18, with the upper glass cap being provided.

FIGS. 18 and 19 show an acceleration sensor according to a fifth embodiment of the present invention. In this embodiment, a step portion 23a is formed on an upside of the beam portion 23 by setting a surface of the support portion 21 higher than that of the weight portion 22 as shown in FIGS. 18 and 19 and each of the carbon nanotube resistance elements 61 and 62 is disposed and fixed so as to stride over the step portion 23a from the surface of the support portion 21 to the surface of the weight portion 22.

Figure 20:
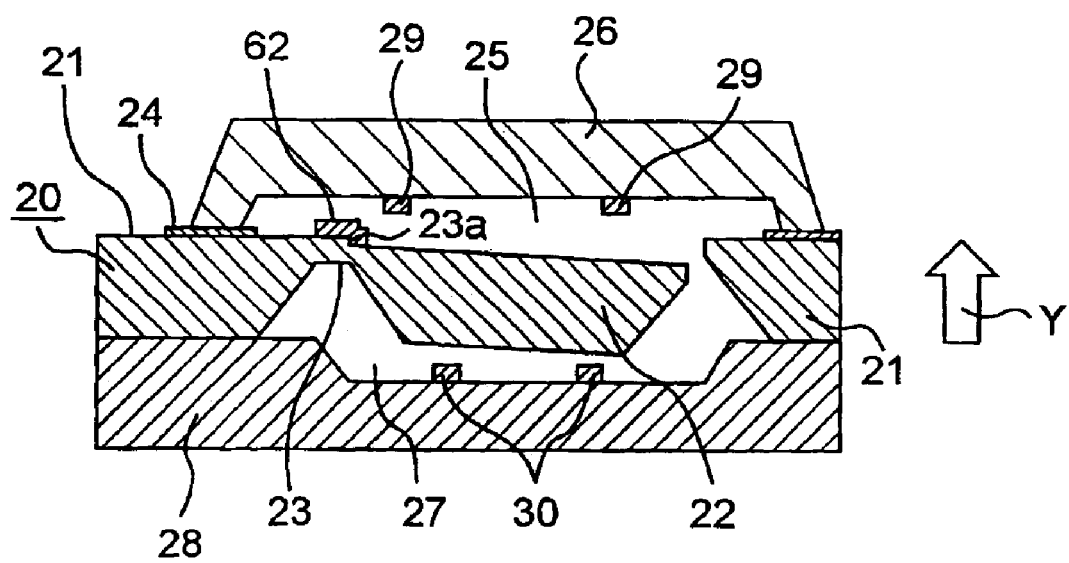
FIG. 20 is a view similar to FIG. 19, particularly showing operation of the acceleration sensor of FIG. 18.

Namely, in the same manner as the step portion 12 of the second embodiment, large change of electric resistance of the carbon nanotube resistance elements 61 and 62 is obtained upon deformation of the beam portions 23 in order to raise sensitivity. Since a function of the step portion 23a is identical with that of the step portion 12 of the second embodiment, the description is abbreviated for the sake of brevity. Meanwhile, since operation of the acceleration sensor at the time an acceleration is applied thereto in the direction of the arrow Y as shown in FIG. 20 is similar to that of the fourth embodiment, the description is abbreviated for the sake of brevity.

Sixth Embodiment

Figure 21:
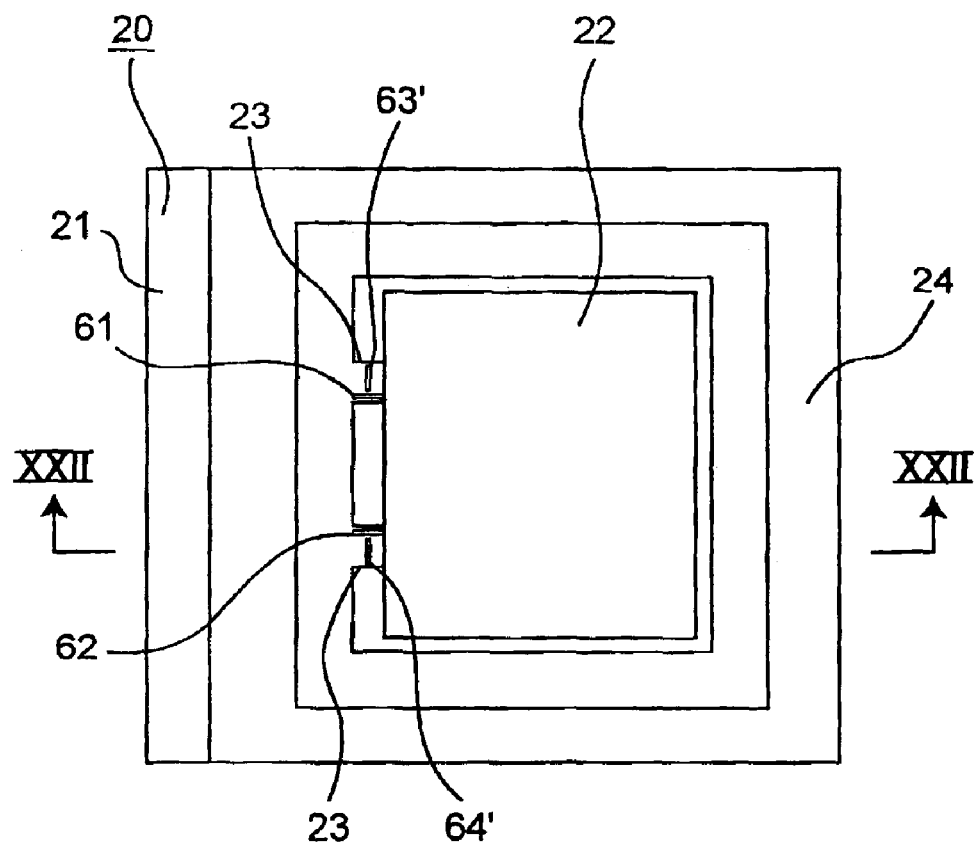
FIG. 21 is a top plan view of an acceleration sensor according to a sixth embodiment of the present invention, with its upper glass cap being removed therefrom.
Figure 22:
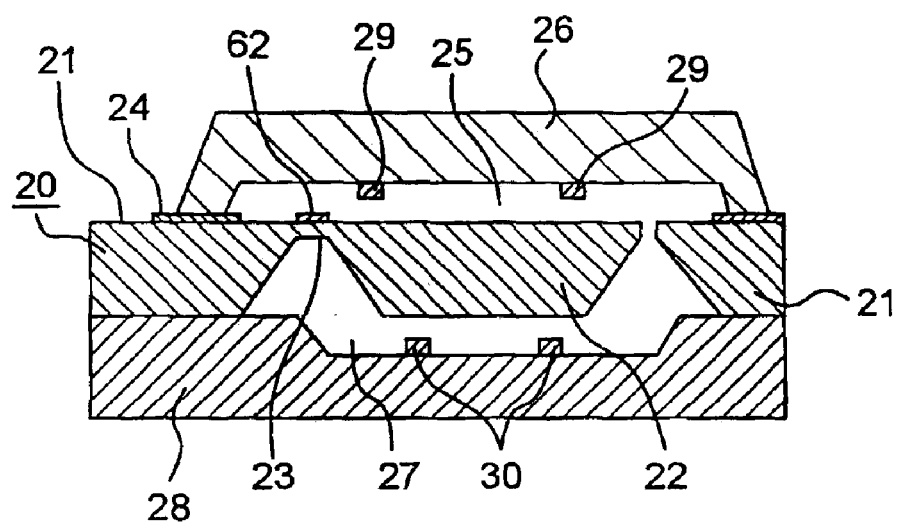
FIG. 22 is a sectional view taken along the line XXII—XXII in FIG. 21, with the upper glass cap being provided.

FIGS. 21 and 22 show an acceleration sensor according to a sixth embodiment of the present invention. In the acceleration sensors of the fourth and fifth embodiments, the reference resistance elements 63 and 64 formed by the carbon nanotubes are provided on the upside of the weight portion 22. In this embodiment, the reference resistance elements 63' and 64' are fixed to the beam portions 23 as shown in FIGS. 21 and 22 such that axes of the reference resistance elements 63' and 64' are orthogonal to those of the carbon nanotube resistance elements 61 and 62. The bridge circuit shown in FIG. 13 is constituted by the resistance elements 61, 62, 63' and 64' formed by carbon nanotubes.

Since other constructions of the acceleration sensor are similar to those of the fourth embodiment, the description is abbreviated for the sake of brevity.

The embodiments have been described above as concrete examples of the present invention. However, it is needless to say that the present invention is not limited to these embodiments but may be modified variously. For example, in case the reference resistance elements are used in the above embodiments, the reference resistance elements may be, needless to say, replaced by diffused resistors. Meanwhile, in the above embodiment, the MEMS sensor employing the silicon substrate is recited as an example but may be replaced by a sensor structure formed by a substrate made of another semiconductor material. In the present invention, since the carbon nanotubes are used as the detection elements, there is no restriction that a semiconductor substrate should be used as the substrate as in a configuration based on piezoelectric resistance, so that a substrate made of an insulating material such as glass can also be used.

Furthermore, the above embodiments are directed to the pressure sensor and the acceleration sensor. However, it goes without saying that a tactile sensor for detecting contact pressure, a sound wave sensor (microphone) for detecting air pressure, an ultrasonic sensor, a sensor for detecting such pressure change of a human body as throbbing, pulse, etc. upon change of pulsation by applying to the human body its portion deformable by the pressure, etc. may be, needless to say, used as the mechanical deformation amount sensor.

As is clear from the foregoing description, since the mechanical deformation amount sensor of the present invention can detect, as an electrical signal based on change of electrical conductivity of the carbon nanotube resistance elements, magnitude of a physical quantity applied to the sensor structure, such a remarkable effect is gained that by utilizing electrical characteristics of the carbon nanotube, the physical quantity can be detected at higher sensitivity than prior art configurations employing, for example, a piezoelectric resistance element.

The present disclosure relates to subject matter contained in priority Japanese Patent Application No. 2002-211654, filed on Jul. 19, 2002, the contents of which is herein expressly incorporated by reference in its entirety.

What is claimed is:

1. A mechanical deformation amount sensor, comprising:
   a sensor structure formed by one of a semiconductor substrate and an insulating substrate and integrally includes a deformation portion deformable, when a physical quantity to be detected is applied to the sensor structure, due to the physical quantity and a support portion for supporting the deformation portion;
   a first carbon nanotube resistance element provided on deformation portion to be mechanically deformed when the physical quantity to be detected is applied to said sensor structure;
   a second carbon nanotube resistance element provided on said support portion that is not deformed when the physical quantity to be detected is applied to said sensor structure; and
   a wiring pattern which is formed in a pattern on said sensor structure to be connected to said first carbon nanotube resistance element and said second carbon nanotube resistance element,
   wherein a voltage is applied to the first and second carbon nanotube resistance elements via said wiring pattern such that a change of electrical conductivity of said first carbon nanotube resistance element upon mechanical deformation of said first carbon nanotube resistance element is fetched as an electrical signal.

2. The mechanical deformation amount sensor of claim 1, wherein said deformation portion is formed to be thinner than said support portion and is deformed to be deflected elastically when the physical quantity is applied to said sensor structure.

3. The mechanical deformation amount sensor of claim 1, wherein said sensor structure comprises a micro-electromechanical systems (MEMS) sensor chip formed by a silicon substrate.

4. The mechanical deformation amount sensor of claim 3, wherein said first carbon nanotube resistance element is provided on said deformation portion through an insulating film.

5. The mechanical deformation amount sensor of claim 1, wherein said first carbon nanotube resistance element is disposed such that a longitudinal direction of said first carbon nanotube resistance element is orthogonal to a direction of deformation of said deformation portion.

6. The mechanical deformation amount sensor of claim 1, wherein said wiring pattern has, at an end portion connected to said first carbon nanotube resistance element, a metal electrode such that each of opposite end portions of said first carbon nanotube resistance element is covered by said metal electrode.

7. The mechanical deformation amount sensor of claim 1, wherein a surface of said first carbon nanotube resistance element is covered by an insulating coating film.

8. The mechanical deformation amount sensor of claim 7, wherein said insulating coating film comprises a passivation film provided on a surface of said sensor structure.

9. The mechanical deformation amount sensor of claim 1, wherein the carbon nanotube resistance element is formed by a single-wall carbon nanotube.

10. The mechanical deformation amount sensor of claim 1, which acts as a pressure sensor having a fluid pressure as the physical quantity to be detected,
wherein in said sensor structure, said support portion is formed in a shape of a frame and said deformation portion is formed by a diaphragm occupying an inside space of said frame of said support portion such that said diaphragm bears the fluid pressure.

11. The mechanical deformation amount sensor of claim 10, wherein said carbon nanotube resistance element is provided at a peripheral edge portion of said diaphragm.

12. A mechanical deformation amount sensor, comprising:
a sensor structure formed by one of a semiconductor substrate or an insulating substrate and integrally including a deformation portion that is deformable, when a physical quantity to be detected is applied to said sensor structure, due to the physical quantity and a support portion for supporting said deformation portion;
a carbon nanotube resistance element provided on said deformation portion to be mechanically deformed in response to a deformation of said deformation portion; and
a wiring pattern formed in a pattern on said sensor structure to be connected to said carbon nanotube resistance element, wherein a voltage is applied to said carbon nanotube resistance element via said wiring pattern, such that a change of electrical conductivity of said carbon nanotube resistance element upon mechanical deformation of said carbon nanotube resistance element is fetched as an electrical signal, a reference resistance element being provided at a portion of said sensor structure other than said deformation portion, said reference resistance element and said carbon nanotube resistance element being connected to each other by said wiring pattern to form a bridge circuit.

13. The mechanical deformation amount sensor of claim 12, wherein said reference resistance element comprises a carbon nanotube.

14. A mechanical deformation amount sensor, comprising:
a sensor structure formed by one of a semiconductor substrate or an insulating substrate and integrally including a deformation portion that is deformable, when a physical quantity to be detected is applied to said sensor structure, due to the physical quantity and a support portion for supporting said deformation portion;
a carbon nanotube resistance element provided on said deformation portion to be mechanically deformed in response to a deformation of said deformation portion; and
a wiring pattern formed in a pattern on said sensor structure to be connected to said carbon nanotube resistance element, wherein a voltage is applied to said carbon nanotube resistance element via said wiring pattern, such that a change of electrical conductivity of said carbon nanotube resistance element upon mechanical deformation of said carbon nanotube resistance element is fetched as an electrical signal, a step portion being formed on said deformation portion, said carbon nanotube resistance element being provided on said deformation portion so as to stride over said step portion.

15. A mechanical deformation amount sensor, comprising:
a sensor structure formed by one of a semiconductor substrate or an insulating substrate and integrally including a deformation portion that is deformable, when a physical quantity to be detected is applied to said sensor structure, due to the physical quantity and a support portion for supporting said deformation portion;
a carbon nanotube resistance element provided on said deformation portion to be mechanically deformed in response to a deformation of said deformation portion; and
a wiring pattern formed in a pattern on said sensor structure to be connected to said carbon nanotube resistance element, wherein a voltage is applied to said carbon nanotube resistance element via said wiring pattern, such that a change of electrical conductivity of said carbon nanotube resistance element upon mechanical deformation of said carbon nanotube resistance element is fetched as an electrical signal, said carbon nanotube resistance element being formed by a single-wall carbon nanotube, wherein said carbon nanotube resistance element is formed by a plurality of single-wall carbon nanotubes which are arranged side by side and are electrically connected to each other in parallel.

16. A mechanical deformation amount sensor, comprising:
a sensor structure formed by one of a semiconductor substrate or an insulating substrate and integrally including a deformation portion that is deformable, when a physical quantity to be detected is applied to said sensor structure, due to the physical quantity and a support portion for supporting said deformation portion;

a carbon nanotube resistance element provided on said deformation portion to be mechanically deformed in response to a deformation of said deformation portion; and a wiring pattern formed in a pattern on said sensor structure to be connected to said carbon nanotube resistance element, wherein a voltage is applied to said carbon nanotube resistance element via said wiring pattern, such that a change of electrical conductivity of said carbon nanotube resistance element upon mechanical deformation of said carbon nanotube resistance element is fetched as an electrical signal, said mechanical deformation amount sensor acting as an acceleration sensor having an acceleration as the physical quantity to be detected, wherein said sensor structure further includes a weight portion integrally coupled with said support portion by said deformation portion.

* * * * *